(12) United States Patent
Kolehmainen

(10) Patent No.: US 11,851,746 B2
(45) Date of Patent: Dec. 26, 2023

(54) PULSED CATHODIC ARC DEPOSITION

(71) Applicant: Oerlikon Surface Solutions AG, Pfäffikon, Pfäffikon (CH)

(72) Inventor: Jukka Kolehmainen, Espoo (FI)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 116 days.

(21) Appl. No.: 17/430,026

(22) PCT Filed: Feb. 10, 2020

(86) PCT No.: PCT/EP2020/000040
§ 371 (c)(1),
(2) Date: Aug. 11, 2021

(87) PCT Pub. No.: WO2020/173598
PCT Pub. Date: Sep. 3, 2020

(65) Prior Publication Data
US 2022/0112591 A1 Apr. 14, 2022

Related U.S. Application Data

(60) Provisional application No. 62/811,641, filed on Feb. 28, 2019.

(51) Int. Cl.
 *C23C 14/32* (2006.01)
 *H01J 37/32* (2006.01)
 *H01J 37/34* (2006.01)

(52) U.S. Cl.
 CPC ...... *C23C 14/325* (2013.01); *H01J 37/32055* (2013.01); *H01J 37/3438* (2013.01); *H01J 2237/332* (2013.01)

(58) Field of Classification Search
 CPC .............. H01J 37/34; H01J 37/32614; H01J 37/32596; H01J 37/32587;
(Continued)

(56) References Cited

U.S. PATENT DOCUMENTS

| | | | |
|---|---|---|---|
| 2003/0226504 A1 | 12/2003 | Kolpakov et al. | |
| 2004/0124080 A1* | 7/2004 | Murakami | H01J 37/32055 204/298.41 |
| 2005/0045472 A1* | 3/2005 | Nagata | H01J 37/3266 204/298.41 |
| 2008/0020138 A1* | 1/2008 | Ramm | C23C 14/325 427/540 |
| 2010/0059369 A1* | 3/2010 | Shiina | H01J 37/32633 204/298.41 |

(Continued)

FOREIGN PATENT DOCUMENTS

| | | |
|---|---|---|
| EP | 0277341 A2 | 8/1988 |
| EP | 2679702 A1 | 1/2014 |

(Continued)

OTHER PUBLICATIONS

Machine Translation JP 06-280001 (Year: 1994).*

(Continued)

*Primary Examiner* — Rodney G McDonald
(74) *Attorney, Agent, or Firm* — Bret E. Field; Bozicevic, Field & Francis LLP

(57) ABSTRACT

An assembly for cathodic arc deposition of a material onto an article. The assembly includes a chamber for receiving an article to be coated and a rotating target. The rotatable target has a surface from which a plasma material is ejected. An anode ring is positioned a first distance from the surface of the rotatable target. The anode ring has an opening with a central axis that is parallel to a rotational axis of the rotatable target and offset a second distance from the rotational axis. A spark device is disposed in the chamber for generating an arc on the surface of the rotatable target. The assembly configured to direct a stream of charged particles ejected from the surface of the target through the opening of the anode ring to the article to be coated.

10 Claims, 3 Drawing Sheets

(58) Field of Classification Search
CPC ........... H01J 37/32568; H01J 37/32055; H01J 37/3438; H01J 2237/332; C23C 13/325; H05H 1/52
USPC ...................................... 204/192.38, 298.41
See application file for complete search history.

(56)     References Cited

U.S. PATENT DOCUMENTS

2010/0276283 A1*  11/2010  Muenz ................ H01J 37/3438
                                                             204/298.14
2018/0247797 A1    8/2018  Gorokhovsky

FOREIGN PATENT DOCUMENTS

| JP | H4-354864 A | 12/1992 |
| JP | 06-280001 | * 10/1994 |
| WO | WO2018226966 A1 | 12/2018 |

OTHER PUBLICATIONS

Examination Report for India Application No. 202127036312 dated Feb. 22, 2023, 7 pages.
Preliminary Report on Patentability for International Application No. PCT/EP2020/000040 dated Aug. 25, 2021, 7 pages.
Written Opinion for Singaporean Application No. 11202109014P dated Jun. 9, 2023, 7 pages.
Decision to Grant for European Application No. 20706378.5 dated Jul. 13, 2023, 2 pages.

* cited by examiner

PULSED CATHODIC ARC DEPOSITION

CROSS-REFERENCE TO RELATED APPLICATIONS

None

FIELD OF THE INVENTION

This application relates generally to an apparatus for physical vapor deposition, and more particularly, to an apparatus for cathodic arc deposition in a coating chamber.

BACKGROUND OF THE INVENTION

Conventionally, cathodic arc deposition is a known physical vapor deposition process wherein a voltage is applied between a metallic material source (i.e., a target) serving as cathode (a negative pole) and an anode (a positive pole). The cathode and the anode, as well as substrates to be coated, are placed in a coating chamber. Prior to depositing a coating on the substrates the coating chamber has to be evacuated. An electron arc is used to evaporate material from the target surface. The electron arc tears electrons from the surface of the target and guides them to the anode. Ignition of the electron arc is typically achieved by an ignition finger which is in contact with the target surface. At the location where the electrons are leaving the target surface (referred to as the "spot") the surface is heated up very fast and to a high temperature. This rapid heating and high temperature causes the material of the target to be evaporated and then condensed on the surfaces of the substrates to be coated.

During the deposition process, the spot tends to move more or less randomly or "dance" on the surface of the target. Ideally, this causes the material of the target to be removed rather homogeneously.

One issue with the known deposition process is that, if for any reason, the spot remains at the same position on the surface of the target a hole may be burned into the target. This makes the target unusable. In general, removing material from the surface of the target in a non-homogenous manner is a problem. This is especially an issue if reactive gases are used in order to form chemical compound coatings on the substrate. The chemical compound will, as well, form on the surface of the target. If these chemical compounds have poor electrical conductivity (such as for example, many metal-oxide compounds) the spot will be confined to locations at the surface of the target where no chemical compounds have been formed. Such "target poisoning" may cause material to be removed in a non-homogeneous manner and eventually cause the target to be unusable.

The present invention provides an apparatus for improving the homogenous removal of material from a target in a cathodic arc deposition process.

BRIEF SUMMARY OF THE INVENTION

In accordance with one aspect, there is provided an assembly for cathodic arc deposition of a material onto an article. The assembly includes a chamber for receiving an article to be coated. The chamber is evacuated to a pressure below atmospheric pressure. A rotatable target is disposed within the chamber. The rotatable target has a surface from which a plasma material is ejected and a rotational axis. An anode ring is disposed in the chamber and positioned a first distance from the surface of the rotatable target. The anode ring has an opening that extends through the anode ring. A central axis of the opening is positioned parallel to the rotational axis of the rotatable target and offset a second distance from the rotational axis of the rotatable target. A spark device is disposed in the chamber for generating an arc on the surface of the rotatable target. The system may be configured to direct a stream of charged particles ejected from the surface of the rotatable target through the opening of the anode ring to the article to be coated.

The fixture assembly may be configured such that the spark device has a distal end disposed between the opening of the anode ring and the surface of the rotatable target.

The fixture assembly may be configured to further include a focus coil having a helical shape with an axis aligned with the central axis of the anode ring. The focus coil having a first end a third distance from the surface of the rotatable target. The assembly may also include a filter coil having a helical shape with an axis aligned with the central axis of the anode ring. The filter coil axially spaced from the first end of the focus coil. A limiter may extend in a direction perpendicular to the central axis of the anode ring. The limiter is positioned between the first end of the focus coil and the filter coil and has an opening that is axially aligned with the central axis of the anode ring.

The fixture assembly may be configured so that the focus coil is disposed on an outer surface of the chamber.

The fixture assembly may be configured to further include a filter duct attached to an open end of the chamber wherein the filter coil is disposed on an outer surface of the filter duct.

In accordance with another embodiment, there is provided a method for coating an article using a cathodic arc deposition assembly. The assembly includes a target disposed within an evacuated chamber. The target has a surface from which a plasma material is ejected and a rotational axis. An anode ring is disposed in the chamber and positioned a first distance from the surface of the target. The anode ring has an opening extending through the anode ring. A central axis of the opening is positioned parallel to the rotational axis of the target and offset a second distance from the rotational axis of the target. A spark device disposed in the chamber for generating an arc on the surface of the target. The method includes steps of: rotating the target about the rotational axis of the target; and applying a pulsed voltage to the target and the anode to generated plasma pulses are ejected from the surface of the target and directed through the opening of the anode ring to the article to be coated.

The method may be configured such that the spark device has a distal end disposed between the opening of the anode ring and the surface of the target.

The method may be configured such that the voltage applied to the target and the anode is pulsed to generate a series of plasma pulses.

The method may be configured such that the cathodic arc deposition assembly further includes a focus coil having a helical shape with an axis aligned with the central axis of the anode ring. The focus coil has a first end a third distance from the surface of the target. A filter coil is provided having a helical shape with an axis aligned with the central axis of the anode ring. The filter coil is axially spaced from the first end of the focus coil. A limiter extends in a direction perpendicular to the central axis of the anode ring. The limiter is positioned between the first end of the focus coil and the filter coil and has an opening that is axially aligned with the central axis of the anode ring. Prior to the step of applying a voltage there is a step of applying a voltage to the filter coil to generate a uniform magnetic field for filtering the plasma ejected from the surface of the target.

The method may be configured such that the voltage applied to the target and the anode, the voltage applied to the filter coil and a voltage applied to the focus coil are all pulsed to generate a series of plasma pulses.

DESCRIPTION OF EXAMPLE EMBODIMENTS

Figure 1:
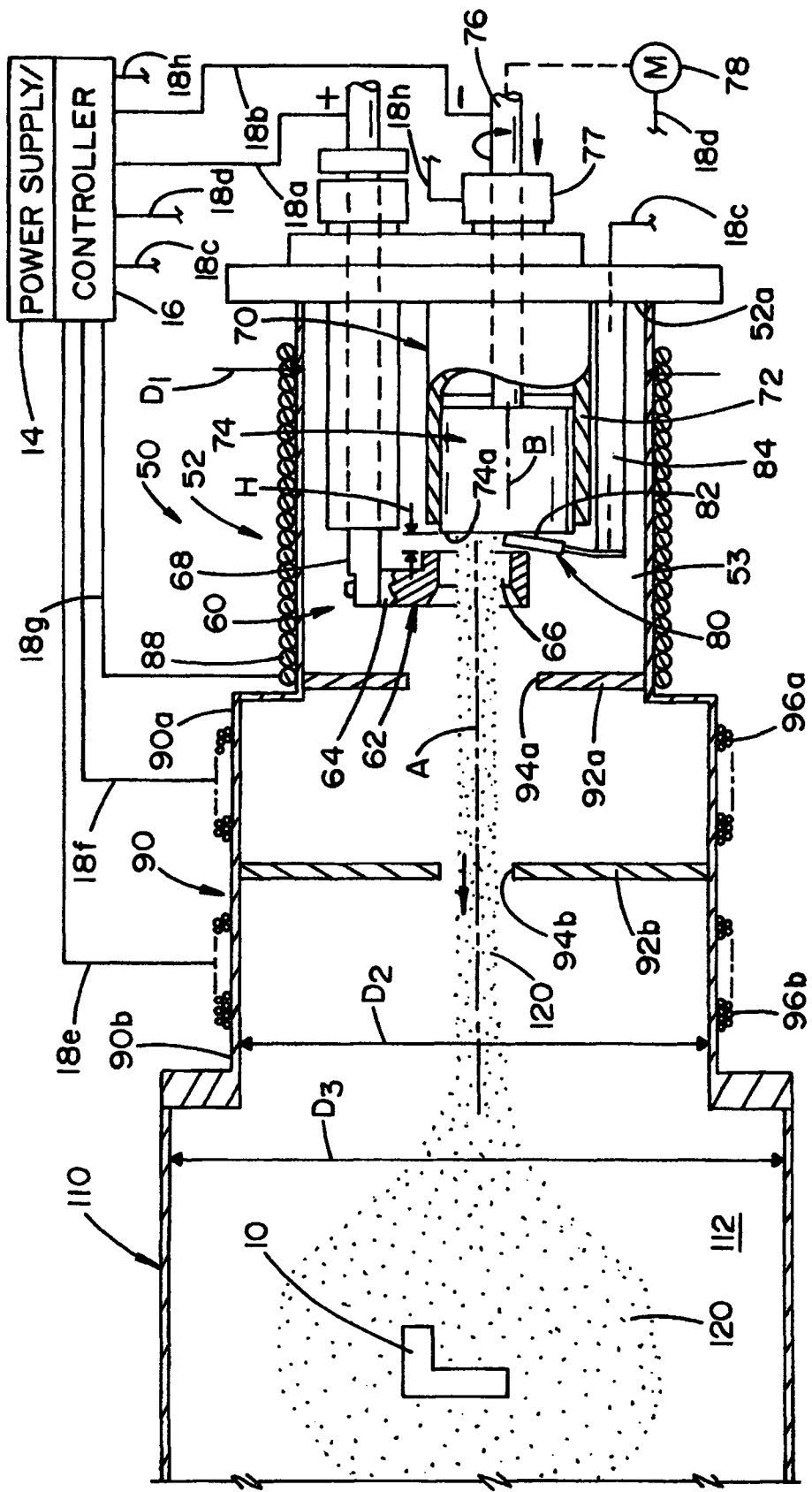
FIG. 1 is a side section view of cathodic arc deposition assembly, according to the present invention, showing a confinement anode positioned above a surface of a rotating target and adjacent an induction coil with a controller and a power source shown schematically.

Referring now to the drawings, FIG. 1 shows a cathodic arc deposition assembly 50 for depositing a coating on one or more articles 10 to be coated. The cathodic arc deposition assembly 50, in general, includes a chamber 52, a confinement anode assembly 60, a target assembly 70, an ignitor assembly 80, a filter duct 90 and a deposition chamber 110.

FIG. 1 is a side section view of a chamber 52. The chamber 52 defines a cavity 53 for receiving the confinement anode assembly 60, the target assembly 70 and the ignitor assembly 80. In the embodiment shown, the chamber 52 is generally cylindrical in shaped. It is contemplated that the chamber 52 may have a diameter $D_1$ that is large enough to receive the confinement anode assembly 60, the target assembly 70 and the ignitor assembly 80.

Figure 2:
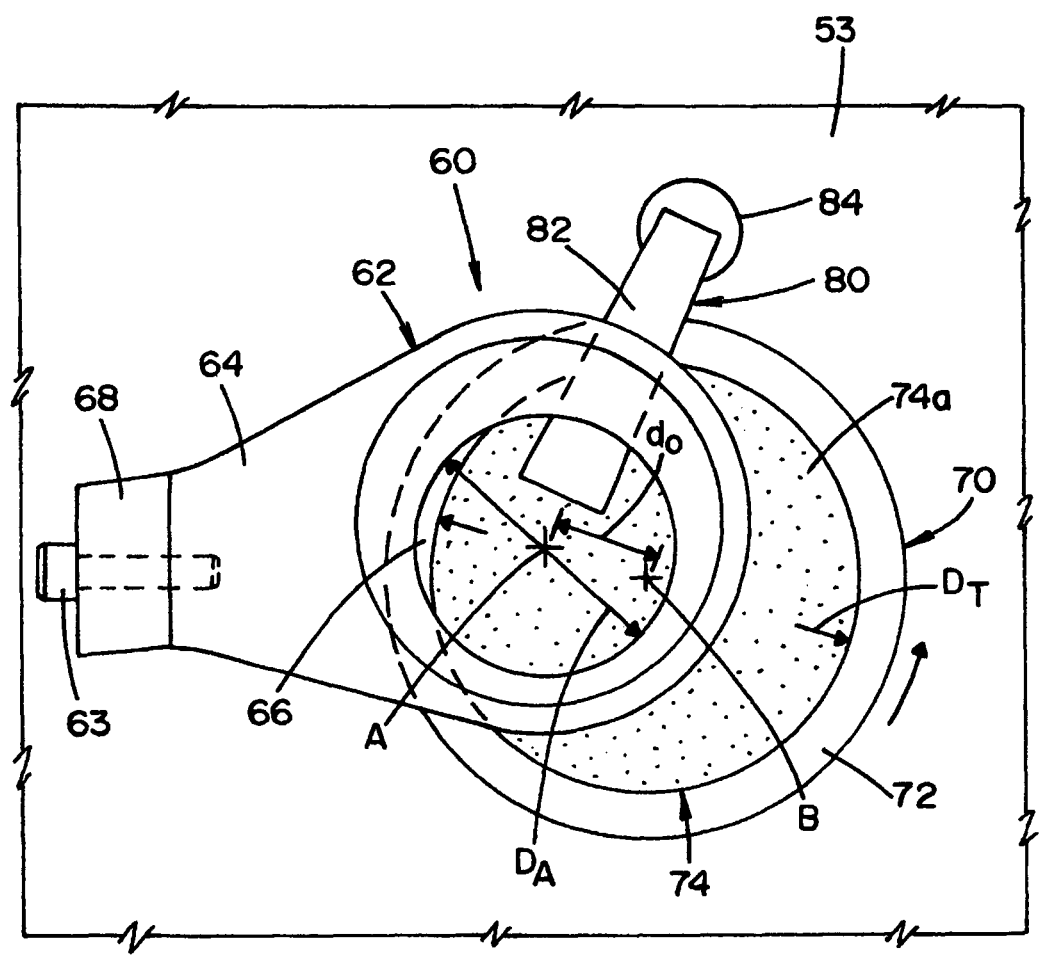
FIG. 2 is an enlarged end view of the confinement anode of FIG. 1 showing the confinement anode positioned relative to a ignitor and the surface of the rotating target.

The confinement anode assembly 60 includes a ring-shaped anode 62 having a base portion 64 that is attached to a stand 68. As shown in FIG. 2, a fastener 63 is provided for securing the base portion 64 of the anode 62 to an upper end of the stand 68. An opposite end of the stand 68 is secured to an end wall 52a of the chamber 52.

An opening 66 extends through the anode 62. The opening 66 defines an axis A of the anode 62. In the embodiment shown, a portion of the anode 62 around a periphery of the opening 66 is chamfered. It is contemplated that a diameter $D_A$ of the opening 66 may be dimensioned relative to a radius of a surface 74a of a target 74, as described in detail below. In the embodiment, shown, the diameter $D_A$ of the opening 66 is 34 mm. The anode 62 is electrically connected to a positive terminal of a power source 14, as explained in detail below.

The target assembly 70 is attached to the end wall 52a of the chamber 52 adjacent the confinement anode assembly 60 such that the target assembly 70 is between the confinement anode assembly 60 and the end wall 52a of the chamber. The target assembly 70 includes a holder 72 for holding a target 74. One end of the target 74 extends out of an open end of the holder 72. This end of the target 74 has a surface 74a that is positioned as described in detail below. A shaft 76 is attached to an opposite end of the target 74. The shaft 76 extends through the end wall 52a and is attached to a motor 78 that imparts rotational movement to the shaft 76 and the target 74. The shaft 76 is also configured to move the target 74 longitudinally along an axis of the shaft 76. It is contemplated that an actuator 77 may be provided for moving the target 74 longitudinally along the axis of the shaft 76. The target 74 has a diameter $D_T$. In the embodiment shown, the diameter $D_T$ is 60 mm and the target 74 is 60 mm in length. A control line 18b electrically connects the target 74 to a negative terminal of the power source 14, as explained in detail below.

The ignitor assembly 80 is attached to the end wall 52a of the chamber 52. The ignitor assembly 80 includes a spark device 82, e.g., a ceramic ignition finger, and a stand 84. The spark device 82 is configured to creating a spark along the surface 74a of the target 74. One end of the spark device 82 is connected to the stand 84 and the stand 84 is secured to the end wall 52a of the chamber 52. It is contemplated that the stand 84 may be attached to the end wall 52a using one or more fastening methods, e.g., screws, welding, threads, etc.

Referring to FIG. 1, the confinement anode assembly 60 is positioned relative to the target assembly 70 such that a distance "H" is between a lower surface of the anode 62 and the surface 74a of the target 74. Referring to FIG. 2, the confinement anode assembly 60 is also positioned relative to the target assembly 70 such that the central axis A of the anode 62 is offset from a central axis B of the target 74 by a distance $d_O$. The ignitor assembly 80 is positioned such that a distal end of the spark device 82 is disposed between the opening 66 of the anode 62 and the surface 74a of the target 74. In the embodiment shown, the distance H is between 4 and 10 mm and the distance $d_O$ is 55 mm$_{[CAJ1]}$. It is contemplated that the diameter $D_A$ of the anode 62 may be half the diameter $D_T$ of the target 74. In the embodiment shown, the diameter $D_A$ is 34 mm and the diameter Dr is 60 mm, i.e., the diameter $D_A$ is 57% of the diameter $D_T$.

Referring back to FIG. 1, a focus coil 88 is wrapped around an outer cylindrical wall of the chamber 52. In the embodiment shown, the focus coil 88 is helical in shape and is made of copper tubing. The focus coil 88 is configured to allow a cooling fluid, e.g., water to flow therethrough to assist in maintaining the chamber 52 at desired temperature during operation. In the embodiment shown, the focus coil 88 has a diameter of 160 mm, a length of 170 mm and an inductance of 36.5 microHenries (µH). Since the focus coil 88 is wrapped around the outer wall of the chamber 52, the diameter $D_1$ of the chamber 52 may be selected to be appropriately smaller than 160 mm.

The filter duct 90 includes a first end 90a that is attached to an open end of the chamber 52. The filter duct 90 is generally cylindrical in shape and two limiters 92a, 92b and two filter coils 96a, 96b are attached to the filter duct 90.

The limiters 92a, 92b are plate-shaped elements that extend across a cavity of the filter duct 90 in a direction perpendicular to the axis A of the anode 62. Each limiter 92a, 92b includes a respective opening 94a, 94b that is axially aligned with the axis A of the anode 62. A first limiter 92a is positioned at the first end 90a of the filter duct. A second limiter 92b is positioned midway between the first end 90a and a second end 90b of the filter duct 92.

The first and second filter coils 96a, 96b are wrapped around an outer cylindrical surface of the filter duct 90. The first filter coil 96a is positioned between the limiters 92a, 92b. The second filter coil 96b is positioned between the second limiter 92b and the second end 90b of the filter duct 90. In the embodiment shown, a diameter $D_2$ of the filter duct 90 is 220 mm and a length of the filter duct 90 is 188 mm.

The deposition chamber 110 is attached to the second end 90b of the filter duct 90. The deposition chamber 110 defines a cavity 112 that is dimensioned to receive the article 10 to be coated. In the embodiment shown, the deposition chamber 110 has a diameter $D_3$ that is larger than the diameter $D_2$ of the filter duct 90.

As described above, the confinement anode assembly, 60, the target assembly 70 and the ignitor assembly 80 are all attached to the end wall 52a of the chamber 52. It is contemplated that one or more of the foregoing assemblies may be attached to other portions of the chamber 52, to each other, or to another structure in the chamber 52 so long as the relative positions of the anode 62, the target 74 and the spark device 82 (as described in detail above) are maintained. In particular, the anode 62 is a distance H from the surface 74a of the target 74 and offset a distance $d_O$ from the axis B of the target 74 and the spark device 82 is positioned between the opening 66 of the anode 62 and the surface 74a of the target 74, as described in detail above.

A controller 16 is provided for controlling the operation of the various components of the cathodic arc deposition assembly 50. Various control lines 18a-18g extend from the controller 16 to the components, i.e., the control line 18a connects the controller 16 to the anode 62, a control line 18b connects the controller 16 to the target 74, a control line 18c connects the controller 16 to the spark device 82, a control line 18d connects the controller 16 to the motor 78, control lines 18e, 18f connect the controller 16 to the first filter coil 96a and the second filter coil 96b, respectively, a control line 18g connects the controller 16 to the focus coil 88 and a control line 18h connects the controller 16 to the actuator 77. It is contemplated that the control lines 18a-18h may be configured to send power and/or signals between the respective component and the controller 16. It is also contemplated that the controls lines 18a-18h may represent other commonly known types of wired and/or wireless communication between the controller 16 and the various components of the cathodic arc deposition assembly 50, including but not limited to, hard wire, WiFii, ethernet, etc$_{[CAJ2]}$. and combinations thereof.

The cathodic arc deposition assembly 50 will now be described with respect to the operation of the same. During operation of the cathodic arc deposition assembly 50, a voltage is supplied to the anode 62 and the target 74. The foregoing results in the generation of a spark at the surface 74a of the target 74 and a stream of carbon plasma 120 being ejected from the target 74 to the articles 10 to be coated. It is contemplated that the voltage applied to the anode 62 and the target 74 may be pulsed to generate a pulse of carbon plasma 120.

It is also contemplated that the focus coil 88 may be configured to direct or focus the carbon plasma 120 through the opening 66 of the anode 62 to the articles 10 to be coated. In the embodiment wherein the voltage to the anode 62 and the target 74 is pulsed, the focus coil 88 and the filter coils 96a, 96b may be part of a pulse circuit (not shown) and due to the inductive nature of the focus coil 88 and the filter coils 96a, 96b they contribute to a pulsing effect of the cathodic arc deposition assembly 50. As such, the cathodic arc deposition assembly 50 avoids the need for a complicated pulse generator.

Figure 3:
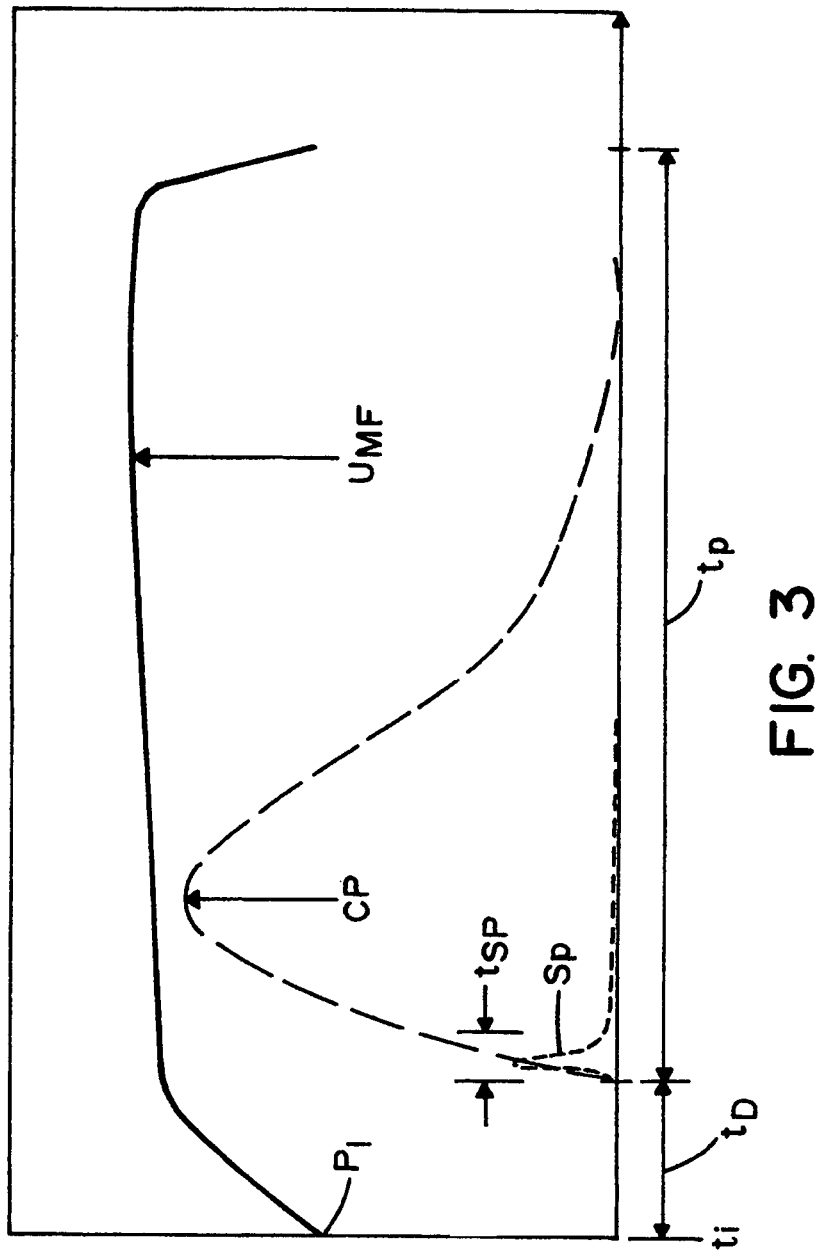
FIG. 3 is a diagram illustrating one pulse of carbon plasma, according to one embodiment of the present invention.

The operation of the cathodic arc deposition assembly 50 will now be described with particular reference to FIG. 3 which illustrated one pulse of carbon plasma 120.$_{[CAJ3]}$ As noted above, the controller 16 may be configured to control the operation of the various components of the cathodic arc deposition assembly 50. At time ti i.e., prior to igniting a spark at the spark device 82, the controller 16 may cause a current to be applied through the filter coils 96a, 96b (point Pi). In one embodiment, a current of 60 Amps is applied for a delay time ($t_D$) of 0.6 milliseconds (ms). The foregoing current creates a uniform magnetic field ($U_{MF}$) that lasts the remainder of a pulse time ($t_P$) for filtering the carbon plasma 120 that is expelled from the surface 74a of the target 74, as explained in detail below. In the embodiment shown, the pulse time ($t_P$) is 3 milliseconds (ms).

After the delay time ($t_D$), the controller 16 may cause a high voltage pulse to be applied to the spark device 82 for a spark pulse time ($t_{SP}$) to generate a spark pulse ($S_P$). In the embodiment shown, the high voltage pulse is 10 to 800 Volts and the spark pulse time ($t_{SP}$) is 30 microseconds (μs). The high voltage pulse is configured to ignite a pulse arc on the surface 74a of the target 74. At this time the target 74 is rotating at a speed. In the embodiment shown, the target 74 rotates at 3 RPM. The spark pulse ($S_P$) causes a pulse of carbon plasma (CP) to be ejected from the surface 74a of the target 74.

The power source 14 is connected to the anode 62 through the focus coil 88. In the embodiment shown, the power source 14 is a capacitor bank of 9 millifarads (mF) with a voltage of 100 to 250 volts. An arc current of 1.5 to 1.8 kiloampere (kA) is formed between the anode 62 and the target 74 and flows through the focus coil 88 creating a high axial dipole moment to the axis A. A magnetic flux density reaches a peak value of 0.5 to 1 Tesla and raises a plasma sheath potential between the anode 62 and the target 74 to increase the kinetic energy of the carbon plasma 120 to 50 to 100 electronvolts (eV). The high axial dipole moment focuses the carbon plasma 120 along a center line of the filter coils 96a, 96b (which are aligned with the axis A of the anode 62). The focus coil 88 also stabilizes the current of the arc and reduces the length of the pulse of the arc to 2.5 ms.

The carbon plasma 120 then flows into the filter duct 90 where the filter coils 96a, 96b create a magnetic flux density of 50 to 100 millitesla (mT) in order to keep the confinement of the carbon plasma 120 and for filtering of macroparticles from the carbon plasma 120. The limiters 92a, 92b are configured to collect the macroparticles that scatter out from the carbon plasma 120. In particular, the carbon plasma 120 is made of charged particles that are forced into circular orbits in a direction perpendicular to the axis A, whereas the macroparticles are uncharged particles are not forced into the same orbits. The limiters 92a, 92b and the filter coils 96a, 96b operate together to blocked the uncharged macroparticles for moving toward the article 10 to be coated.

The present invention rotates the target 74 such that the arc generated by the spark device 82 moves around the surface 74a of the target 74 in a uniform manner.

The foregoing describes a single pulse of the cathodic arc deposition assembly 50. The foregoing steps are repeated, as needed, to generate a plurality of pulses of carbon plasma 120 for coating the article 10. As described in detail above, prior to each spark pulse ($S_P$) a voltage is applied to the filter coil to generate a uniform magnetic field for filtering the pulses of carbon plasma 120 ejected from the surface 74a of the target 74.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims and their equivalents.

What is claimed is:

1. An assembly for cathodic arc deposition of a material onto an article, the assembly comprising:

a chamber for receiving an article to be coated, the chamber being evacuated to a pressure below atmospheric pressure;

a rotatable target disposed within the chamber, the rotatable target having a surface from which a plasma material is ejected and a rotational axis;

an anode ring disposed in the chamber and positioned a first distance from the surface of the rotatable target, the anode ring having an opening extending through the anode ring, a central axis of the opening positioned parallel to the rotational axis of the rotatable target and offset a second distance from the rotational axis of the rotatable target; and a spark device disposed in the chamber for generating an arc on the surface of the rotatable target, wherein the assembly is configured to direct a stream of charged particles ejected from the surface of the rotatable target through the opening of the anode ring to the article to be coated.

2. The assembly according to claim 1, wherein the spark device has a distal end disposed between the opening of the anode ring and the surface of the rotatable target.

3. The assembly according to claim 1, further comprising:

a focus coil having a helical shape with an axis aligned with the central axis of the anode ring, the focus coil having a first end a third distance from the surface of the rotatable target;

a filter coil having a helical shape with an axis aligned with the central axis of the anode ring, the filter coil axially spaced from the first end of the focus coil; and a limiter extending in a direction perpendicular to the central axis of the anode ring, the limiter positioned between the first end of the focus coil and the filter coil and having an opening that is axially aligned with the central axis of the anode ring.

4. The assembly according to claim 3, wherein the focus coil is disposed on an outer surface of the chamber.

5. The assembly according to claim 3, further comprising a filter duct attached to an open end of the chamber wherein the filter coil is disposed on an outer surface of the filter duct.

6. A method for coating an article using a cathodic arc deposition assembly, the cathodic arc deposition assembly comprising a target disposed within an evacuated chamber, the target having a surface from which a plasma material is ejected and a rotational axis, an anode ring disposed in the evacuated chamber and positioned a first distance from the surface of the target, the anode ring having an opening extending through the anode ring, a central axis of the opening positioned parallel to the rotational axis of the target and offset a second distance from the rotational axis of the target and a spark device disposed in the evacuated chamber for generating an arc on the surface of the target, the method comprising the steps of:

rotating the target about the rotational axis of the target; and applying a voltage to the target and the anode to cause plasma to be ejected from the surface of the target and directed through the opening of the anode ring to the article.

7. The method according to claim 6, wherein the spark device has a distal end disposed between the opening of the anode ring and the surface of the rotatable target.

8. The method according to claim 6, wherein the voltage applied to the target and the anode is pulsed to generate a series of plasma pulses.

9. The method according to claim 6, the cathodic arc deposition assembly further comprises:

a focus coil having a helical shape with an axis aligned with the central axis of the anode ring, the focus coil having a first end a third distance from the surface of the target;

a filter coil having a helical shape with an axis aligned with the central axis of the anode ring, the filter coil axially spaced from the first end of the focus coil; and a limiter extending in a direction perpendicular to the central axis of the anode ring, the limiter positioned between the first end of the focus coil and the filter coil and having an opening that is axially aligned with the central axis of the anode ring, wherein prior to the step of applying a voltage, a step of:

applying a voltage to the filter coil to generate a uniform magnetic field for filtering the plasma ejected from the surface of the target.

10. The method according to claim 9, wherein the voltage applied to the target and the anode, the voltage applied to the filter coil and a voltage applied to the focus coil are pulsed to generate a series of plasma pulses.

* * * * *